United States Patent
Yoshida et al.

(10) Patent No.: US 6,504,248 B2
(45) Date of Patent: Jan. 7, 2003

(54) THIN FILM CIRCUIT SUBSTRATE AND MANUFACTURING METHOD THEREFOR

(75) Inventors: Koji Yoshida, Kusatsu (JP); Makoto Tose, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/059,629

(22) Filed: Jan. 29, 2002

(65) Prior Publication Data
US 2002/0102496 A1 Aug. 1, 2002

(30) Foreign Application Priority Data
Jan. 29, 2001 (JP) ........................................ 2001-020329

(51) Int. Cl.$^7$ .............................................. H01L 23/48
(52) U.S. Cl. ........................ 257/753; 257/759; 438/623
(58) Field of Search ................................ 257/753, 758, 257/759; 438/622, 623, 677

(56) References Cited

U.S. PATENT DOCUMENTS 5,882,956 A * 3/1999 Umehara et al. ............ 438/114
5,905,117 A * 5/1999 Yokotsuka et al. .......... 525/104
5,945,203 A * 8/1999 Soane ......................... 428/209
6,048,786 A * 4/2000 Kudo .......................... 438/622
6,214,249 B1 * 4/2001 Li et al. ....................... 216/67
6,306,694 B1 * 10/2001 Yamazaki et al. ........... 438/151

FOREIGN PATENT DOCUMENTS

| JP | 08-134639 | 5/1996 |
| JP | 09-219586 | 8/1997 |

* cited by examiner

Primary Examiner—T. N. Quach
(74) Attorney, Agent, or Firm—Keating & Bennett, LLP (57) ABSTRACT

A thin film circuit substrate is manufactured by forming a lower thin film electrode on a substrate, forming an organic insulating film with via holes on the lower thin film electrode, and irradiating the substrate with an inert gas ion to remove an oxidized surface film on the lower thin film electrode, and to generate functional groups, such that a modified surface layer with a surface modification coefficient of about 0.1 to about 0.5 is formed on the surface of the organic insulating film, and such that the oxidized surface film on the lower thin film electrode is removed at the same time. Accordingly, a thin film circuit substrate having excellent adhesion strength between the organic insulating film and the upper thin film electrode as well as excellent reliability of electroconductivity between the upper and the lower thin film electrodes is efficiently manufactured.

10 Claims, 4 Drawing Sheets

THIN FILM CIRCUIT SUBSTRATE AND MANUFACTURING METHOD THEREFOR

BACKGROUND OF THE INVENTION

1. Field of the Invention

The present invention relates to a thin film circuit substrate for use in the microwave and millimeter wave regions, and a manufacturing method therefor. In particular, the present invention relates to a thin film circuit substrate using an organic insulating film as an insulating film that is located between an upper thin film electrode and a lower thin film electrode, and a manufacturing method therefor.

2. Description of the Related Art

In recent years, wireless communication application industries have been facing increased requirements of miniaturization, lower price, and higher performance for high-frequency devices used in high frequency regions such as the microwave region and the millimeter wave region.

Also, for the above-described high-frequency devices, transmission lines having low transmission loss and a high efficiency are required. While electrode materials having a low resistance are used for wiring lines (electrodes) to connect the transmission lines, it is believed that dielectric materials having a low dielectric constant and a low dielectric loss tangent are necessary for insulating films provided between the wiring lines.

In complying with such requirements, various wiring substrates have been developed, in which low-resistance materials such as Au, Cu, Ag, and Al are used as electrode materials, and organic resins having a low dielectric constant and a low dielectric loss tangent such as a polyimide resin, an epoxy resin, a benzocyclobutene resin, and a bismaleimide triazine resin are used as insulating films provided between the wiring lines.

Figure 6:
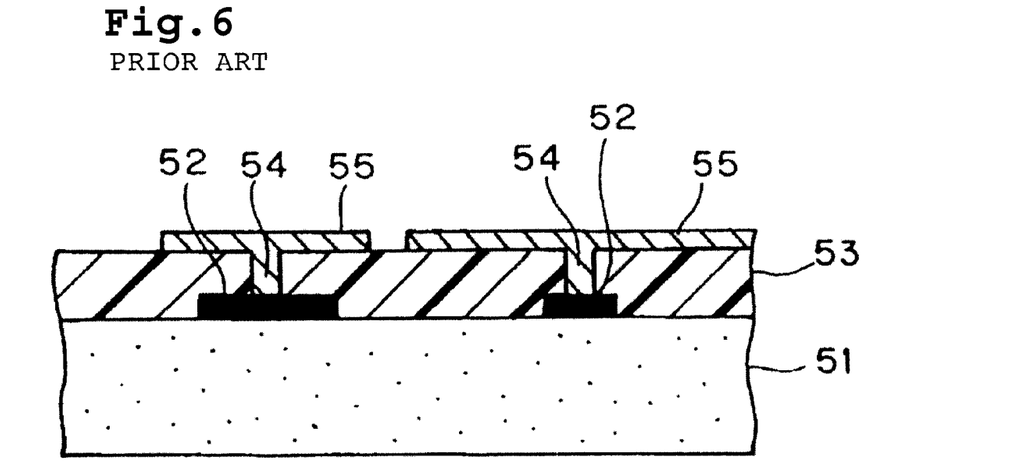
FIG. 6 is a cross-sectional view schematically showing the structure of a thin film circuit substrate in the related art.

One example of such a wiring substrate is a thin film circuit substrate as shown in FIG. 6, including a substrate 51 composed of a ceramic such as alumina, lower thin film electrodes 52 provided on the substrate 51, an organic insulating film 53 provided over the lower thin film electrodes 52, and upper thin film electrodes 55 that are provided on the organic insulating film 53 and are connected to the lower thin film electrodes 52 by via holes 54 provided in the organic insulating film 53.

In the thin film circuit substrate shown in FIG. 6, a problem arises in that the adhesion strength between the organic insulating film 53, which is an organic resin, and the upper thin film electrodes 55, which are made of an electrode material, is not sufficiently strong which causes delamination of the films in the process of forming wiring lines and in the wire bonding step of the wiring lines.

Furthermore, there is a problem in that the reliability of electroconductivity between the upper thin film electrodes 55 and the lower thin film electrodes 52 is decreased due to the fact that the surface of the lower thin film electrodes 52 is oxidized.

Accordingly, to improve the adhesion strength between the organic resin and an electrode material, various methods have been proposed, including:

(1) a method for improving the adhesion strength between the organic resin and an electrode material by surface-treating the surface of the organic resin with an oxygen plasma, as described in Japanese Unexamined Patent Application Publication No. 8-134639; and (2) a method for improving the adhesion strength by providing a polar polymer on the organic resin, as described in Japanese Unexamined Patent Application Publication No. 9-219586.

However, in method (1) wherein the surface of the organic resin is treated with an oxygen plasma, although the adhesion strength between the electrode material and organic resin is improved, there is a problem in that the electrical properties of the organic resin, such as dielectric constant and dielectric loss tangent, are degraded due to oxidization of the surface of the organic insulating film, making it impossible to obtain the desired high-frequency module characteristics.

Furthermore, in method (2) wherein the adhesion strength between the organic resin and the electrode material is improved by providing a polar polymer on the organic resin, although the adhesion between the electrode material and organic resin is improved, there is a problem in that a step for polymerizing a polar monomer is needed after a step for activating the surface of the organic resin which increases the processing time, and results in increased production costs.

There are other possible methods for improving the reliability of electroconductivity between the upper thin film electrode and lower thin film electrode, such as removing the oxidized surface film on the lower thin film electrode by a wet etching method or a dry etching method including an RIE (Reactive Ion Etching) method.

However, when the oxidized surface film on the lower thin film electrode is removed by wet etching after the surface treatment of the organic insulating film, which is an organic resin, although it is possible to improve the reliability of electroconductivity between the upper thin film electrode and the lower thin film electrode, there is a problem in that the adhesion between the upper thin film electrode and the organic insulating film, which is an organic resin, is decreased due to the fact that the surface-treated layer of the organic insulating film in the case of (1) above and the polar polymer provided on the surface of the organic insulating film in the case of (2) above are combined with $H_2O$.

Furthermore, when the oxidized surface film on the lower thin film electrode is removed by a dry etching method, such as an RIE method, after the surface treatment of the organic insulating film, which is an organic resin, there is a problem in that the surface-treated layer of the organic insulating film as well as the polar polymer provided on the surface of the organic insulating film are etched at the same time. Thus, it is not possible to improve the adhesion strength between the upper thin film electrode and the organic insulating film. In addition, the thickness of the organic insulating film is decreased because the organic insulating film itself is etched.

Furthermore, when the oxidized surface film on the lower thin film electrode is removed before the surface treatment of the organic insulating film, there is a problem in that during the oxygen plasma treating step and the polar polymer forming step in the process of surface-treating the organic insulating film after the removal of the oxidized film, an oxidized film is formed again on the surface of the lower thin film electrode. Thus, the reliability of electroconductivity between the upper thin film electrode and the lower thin film electrode is decreased.

Furthermore, in the above-described methods, the manufacturing process is complicated and production costs are substantially increased because the surface treatment step of the organic insulating film and the step for removing the oxidized surface film on the lower thin film electrode are two separate steps.

SUMMARY OF THE INVENTION

To overcome the above-described problems, preferred embodiments of the present invention provide a method for manufacturing a thin film circuit substrate, in which the surface treatment of an organic insulating film and the removal of an oxidized surface film on a lower thin film electrode are performed at the same time. Therefore, a thin film circuit substrate having excellent adhesion strength between the organic insulating film and the upper thin film electrode, as well as excellent reliability of electroconductivity between the upper thin film electrode and the lower thin film electrode is efficiently manufactured.

Additionally, a thin film circuit substrate having excellent adhesion strength between its organic insulating film and its upper thin film electrode as well as excellent reliability of electroconductivity between the upper thin film electrode and its lower thin film electrode is provided.

A preferred embodiment of the present invention provides a method for manufacturing a thin film circuit substrate including the steps of forming a lower thin film electrode or electrodes on a substrate, forming an organic insulating film over the surface of the substrate such that the insulating film covers the lower thin film electrodes, forming a via hole or via holes corresponding to a mask pattern in the organic insulating film using a patterning mask, irradiating the substrate from the side on which the organic insulating film is formed, with at least one type of ion of an inert gas selected from the group consisting of He, Ne, Ar, Kr, and Xe, such that the ion reaches the lower thin film electrodes through the via holes and removes the oxidized surface film on the lower thin film electrodes, and further generates, on the surface of the organic insulating film, at least one type of functional group selected from the group consisting of a sulfone group, a carboxyl group, a carbonyl group, and a phenol group, such that a modified surface layer with a surface modification coefficient of about 0.1 to about 0.5 is formed on the surface of the organic insulating film, the coefficient being determined by equation (1):

surface modification coefficient=total amount of the functional groups/total amount of C existing on the surface of the organic insulating film  (1), and forming an upper thin film electrode or electrodes that are electrically connected to the lower thin film electrodes by the via holes, on the surface of the organic insulating film with the modified surface layer formed thereon.

According to the above-described preferred embodiment of the present invention, an organic insulating film is formed over a lower thin film electrode or electrodes formed on a substrate, a via hole or via holes are formed in the organic insulating film, and irradiation with at least one type of ion of an inert gas selected from the group consisting of He, Ne, Ar, Kr, and Xe is performed on the substrate to remove the oxidized surface film on the lower thin film electrodes, and to generate at least one type of functional group selected from the group consisting of a sulfone group, a carboxyl group, a carbonyl group, and a phenol group, on the surface of the organic insulating film, such that a modified surface layer with a surface modification coefficient of about 0.1 to about 0.5 is formed on the surface of the organic insulating film. Thus, the surface treatment of the organic insulating film and the removal of the oxidized surface film on the lower thin film electrodes are performed at the same time, and therefore, the production process for a thin film circuit substrate is greatly simplified. Furthermore, a thin film circuit substrate having excellent adhesion strength between its organic insulating film and its upper thin film electrodes as well as excellent reliability of electroconductivity between the upper thin film electrodes and its lower thin film electrodes is produced.

It is to be noted that the surface modification coefficient is defined by the ratio of the total amount of the functional group or groups to the total amount of C on the surface of the organic insulating film, and is determined by expression (1):

surface modification coefficient=total amount of the functional groups/total amount of C existing on the surface of the organic insulating film  (1).

The total amount of the functional groups and the total amount of C existing on the surface of the organic insulating film can be measured in atomic percentage, volume, or other suitable unit of measure, and is not particularly limited.

Figure 4:
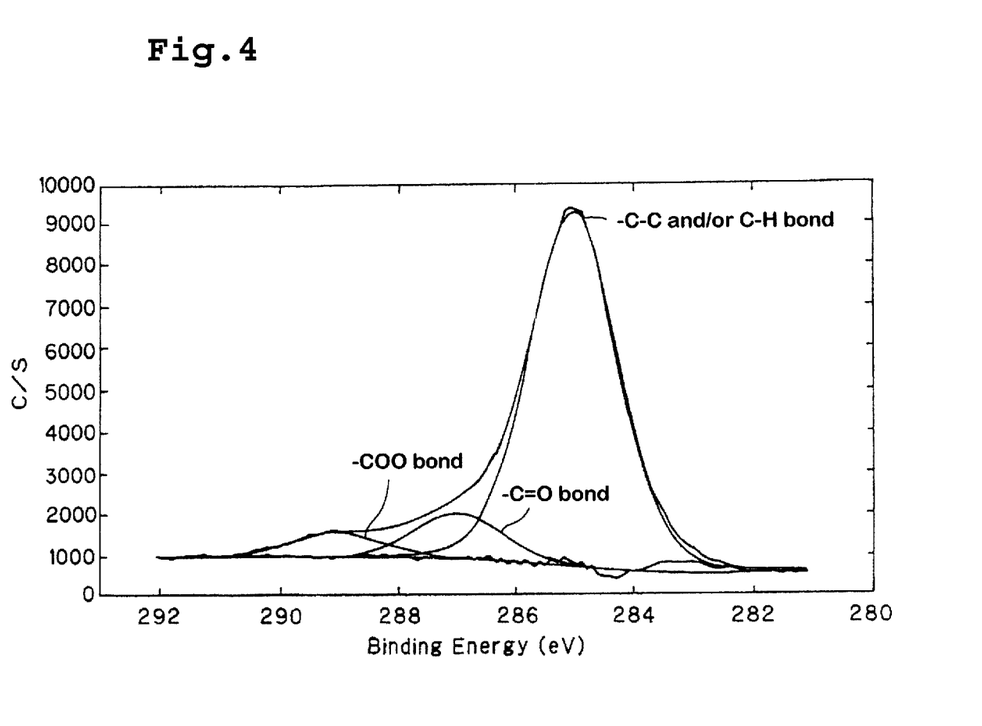
FIG. 4 is a diagram showing the spectra of 1s of C obtained from the surface of an organic insulating film that is surface-treated according to an example of preferred embodiments of the present invention by means of X-ray photoelectron spectroscopy.

The following explains in more detail how to determine the surface modification coefficient according to preferred embodiments of the present invention with reference to FIG. 4.

First, the compositional ratio of C in each bond existing on the surface of the organic insulating film is identified by an X-ray photoelectron spectroscopy.

For example, FIG. 4 shows spectra of 1s of C obtained from the surface of an organic insulating film made of a benzocyclobutene resin by an X-ray photoelectron spectroscopy, in which the proportion of the area for each spectrum represents the compositional ratio (atm %) of C in each bond, and the total of the areas for the spectra represents the total atm % of C within its detection limit. It should be noted that a C1s spectrum represents the distribution of bound energy of the electron which orbits around a K shell among the electrons which orbit around an atomic nucleus of a C atom. Thus, the phrase 1s refers to 1 as the principal quantum number and s as the particular orbit of the electron which orbits around the K shell.

Accordingly, the compositional ratios (area ratios) of C in the C—H bond and/or C—C bond, in the —C=O bond, and in the —COO bond shown in FIG. 4 are about 84 atm %, about 10 atm %, and about 6 atm %, respectively. Therefore, the compositional ratio of the functional groups existing on the surface of the organic insulating film to C existing on the same surface is about 16 atm %, that is, the sum of the approximately 10 atm % for the —C=O bond and the approximately 6 atm % for the —COO bond. Therefore, the surface modification coefficient in this case is determined by the above-described equation (1) to be approximately 0.16 ($16/100$=0.16).

It should be noted that the upper and lower thin film electrodes according to the present invention are not limited to so-called electrodes and include other components, such as transmission lines and pads.

There is no particular limitation to the shape of the substrate or the material for the composition, and substrates composed of various materials such as ceramics and having arbitrarily chosen shapes can be used in the present invention.

It is also to be noted that the reason that a range of about 0.1 to about 0.5 is chosen for the surface modification coefficient according to preferred embodiments of the present invention is that, when the coefficient is less than about 0.1, the adhesion strength between the upper thin film electrodes and the organic insulating film is insufficient, and when the coefficient is greater than about 0.5, deterioration of the electric properties of the organic insulating film occurs.

Another preferred embodiment of the present invention provides a method for manufacturing a thin film circuit substrate as described above, wherein the organic insulating film includes at least one resin selected from the group consisting of a polyimide resin, an epoxy resin, a benzocyclobutene resin, a bismaleimide triazine resin, an acrylic resin, and a cyclic olefin resin.

The organic insulating film including at least one resin selected from the group consisting of a polyimide resin, an epoxy resin, a benzocyclobutene resin, a bismaleimide triazine resin, an acrylic resin, and a cyclic olefin resin, generates at least one type of functional group selected from the group consisting of a sulfone group, a carboxyl group, a carbonyl group, and a phenol group on the surface of the organic insulating film. Therefore a modified surface layer having a surface modification coefficient of about 0.1 to about 0.5 on the surface of the organic insulating film is produced. Accordingly, the reliability of the organic insulating film is greatly improved.

Still another preferred embodiment of the present invention provides a method for manufacturing a thin film circuit substrate as described above, wherein each upper thin film electrode and lower thin film electrode includes at least one constituent selected from the group consisting of Cu, Ag, Al, Ni, Ti, Cr, NiCr, and Nb.

With each upper thin film electrode and lower thin film electrode including at least one constituent selected from the group consisting of Cu, Ag, Al, Ni, Ti, Cr, NiCr, and Nb, thin film circuit substrates having thin film electrodes with excellent electroconductivity are efficiently manufactured.

Still another preferred embodiment of the present invention provides a method for manufacturing a thin film circuit substrate as described above, wherein the etching rate of the organic insulating film by ion of the inert gas is not more than about ¼ (one fourth) of that of the lower thin film electrodes.

By setting the etching rate of the organic insulating film by ion of the inert gas to be not more than about ¼ of that of the lower thin film electrodes, adverse influences on the electric properties of the organic insulating film due to over-reduction of thickness of the film is effectively prevented, such that thin film circuit substrates having greatly increased reliability are manufactured.

Accordingly, by using an inert gas ion that provides a large difference of etching rates between the lower thin film electrodes and the organic insulating film, and that performs the surface treatment of the organic insulating film to generate functional groups, the surface treatment of the organic insulating film is efficiently performed and to remove of the oxidized surface film on the lower thin film electrodes is removed at the same time, resulting in a simplified manufacturing method and greatly reduced manufacturing costs.

Still another preferred embodiment of the present invention is a thin film circuit substrate including a substrate, a lower thin film electrode or electrodes provided on the surface of the substrate, an organic insulating film having a via hole or via holes, the organic insulating film provided to cover at least the lower thin film electrodes, and an upper thin film electrode or electrodes provided on the organic insulating film which are connected to the lower thin film electrodes through the via holes, wherein an oxidized surface film of the lower thin film electrode is removed from a region where the lower thin film electrode is connected to the upper thin film electrode through the via hole, and a modified surface layer is provided on the surface of the organic insulating film, the modified surface layer having a surface modification coefficient of about 0.1 to about 0.5 determined by equation (1):

surface modification coefficient=total amount of the functional groups/total amount of C existing on the surface of the organic insulating film (1).

According to various preferred embodiments of the present invention, thin film circuit substrates that have excellent reliability of electroconductivity between the upper thin film electrodes and the lower thin film electrodes as well as excellent adhesion strength between the organic insulating film and the upper thin film electrodes are provided. The former advantage is achieved because the oxidized surface film on the regions of the lower thin film electrodes is removed, and the regions are connected to the upper thin film electrode through the via holes. The latter advantage is achieved because a modified surface layer having a surface modification coefficient of about 0.1 to about 0.5 is provided on the surface of the organic insulating film. Thus, the thin film circuit substrates according to preferred embodiments of the present invention are efficiently manufactured by the above-described methods for manufacturing a thin film circuit substrate.

Still another preferred embodiment of the present invention provides a thin film circuit substrate as described above, wherein the organic insulating film includes at least one resin selected from the group consisting of a polyimide resin, an epoxy resin, a benzocyclobutene resin, a bismaleimide triazine resin, an acrylic resin, and a cyclic olefin resin.

With the organic insulating film including at least one resin selected from the group consisting of a polyimide resin, an epoxy resin, a benzocyclobutene resin, a bismaleimide triazine resin, an acrylic resin, and a cyclic olefin resin, functional groups such as a sulfone group, a carboxyl group, a carbonyl group, and a phenol group are generated on the surface of the organic insulating film, such that a modified surface layer having a surface modification coefficient of about 0.1 to about 0.5 is provided on the surface of the organic insulating film, thus greatly increasing the reliability of the substrate.

Still another preferred embodiment of the present invention provides a thin film circuit substrate as described above, wherein the upper thin film electrodes and the lower thin film electrodes include at least one constituent selected from the group consisting of Cu, Ag, Al, Ni, Ti, Cr, NiCr, and Nb.

With the upper thin film electrodes and the lower thin film electrodes including at least one constituent selected from the group consisting of Cu, Ag, Al, Ni, Ti, Cr, NiCr, and Nb, the electroconductivity of the thin film electrodes is greatly improved, and therefore, the electrical properties of the substrate are greatly improved.

Further elements, characteristics, features and advantages of the present invention will become apparent from the following description of preferred embodiments with reference to the attached drawings.

DETAILED DESCRIPTION OF PREFERRED EMBODIMENTS

The following is a preferred embodiment of the present invention to explain the characteristics of the present invention in more detail.

In this preferred embodiment, an alumina substrate is preferably used as a substrate, an upper thin film electrode is a two-layer thin film electrode composed of a Ti film (base film) and a thin Cu film electrode provided thereon, a lower thin film electrode is a thin film electrode composed of a Ti film (base film) and a thin Cu film electrode provided thereon, and an organic insulating film disposed between the upper thin film electrode and the lower thin film electrode is preferably made of a polyimide resin.

Figure 1A:
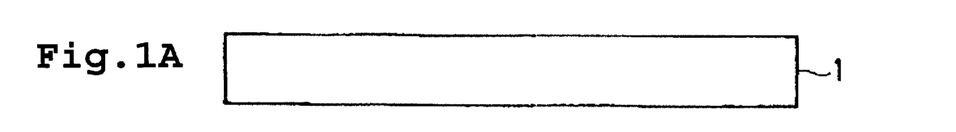
FIGS. 1A to 1F are cross-sectional views showing the steps for manufacturing a thin film circuit substrate according to preferred embodiments of the present invention.

The method according to the present preferred embodiment includes the following steps:

(1) First, an alumina substrate 1 is prepared as shown in FIG. 1A. The surface of the substrate 1 is washed by plasma ashing or with an organic solvent such as acetone, isopropyl alcohol, methanol, or ethanol. As the substrate, it is possible to use not only an alumina substrate but also various other substrates such as semiconductor substrates and dielectric ceramic substrates.

Figure 1B:
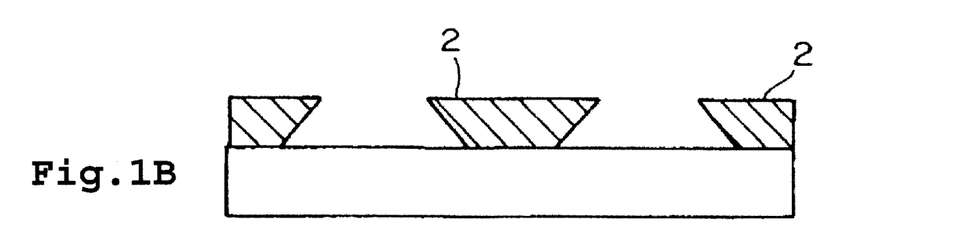

(2) Next, as shown in FIG. 1B, a resist pattern 2 is formed for lifting-off by a chlorobenzene method. In this step, a resist layer having a film thickness of about 6 $\mu$m is first formed by spin coating at about 1,500 rpm for about 30 seconds using a positive-type resist formulation used for thick-films (AZP4620 made by Clariant GmbH). The substrate 1 is then subjected to prebaking in a clean oven at about 90° C. for about 30 minutes and immersed in chlorobenzene kept at about 40° C. for about 10 minutes to form a partially dissolved layer in a developing solution on the surface of the resist. Superfluous chlorobenzene is evaporated by placing the substrate 1 over a hotplate at about 90° C. for about 90 seconds. Then, exposure to an h-ray is performed using a contact exposure apparatus, and the substrate 1 is immersed in an alkaline developing solution AZ400K (made by Clariant GmbH) for about two minutes. After these operations, the substrate 1 is washed with pure water for five minutes or more and dried in a spin drying machine. In this way, a specific resist pattern 2 as shown in FIG. 1B is formed on the substrate 1.

Figure 1C:
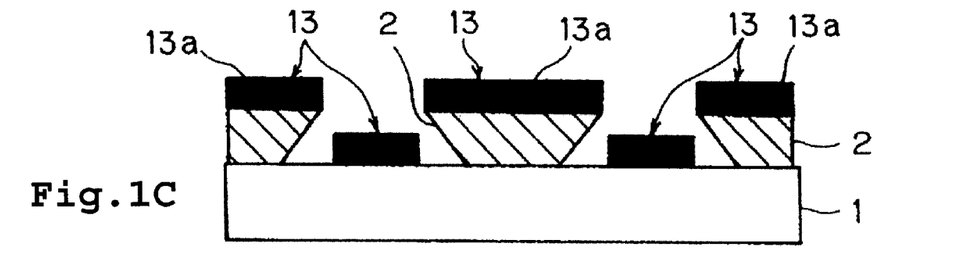

(3) Then, the substrate 1 is placed in a vacuum deposition apparatus to form a Ti film (base film) having a film thickness of about 100 nm that is securely adhered to the substrate 1. Subsequently, a Cu film having a film thickness of about 5 $\mu$m is deposited on the substrate 1 to form electrode films 13 composed of the Ti film and the Cu film for the lower thin film electrode, as shown in FIG. 1C.

Figure 1D:
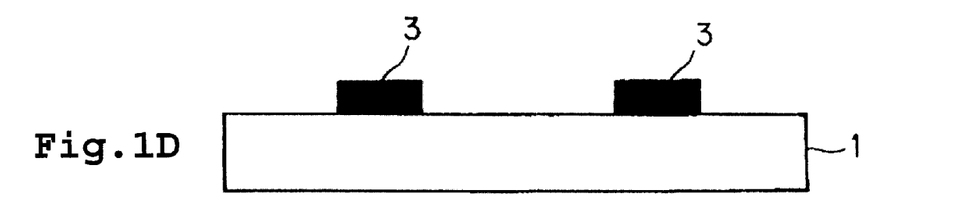

(4) Next, the substrate 1 is immersed in acetone, and ultrasonic waves are applied to the substrate 1 to remove or lift off the resist pattern 2 and an unnecessary portion 13a of the electrode film 13. An electrode pattern 3 for the lower thin film electrode of the present preferred embodiment of present invention is obtained as shown in FIG. 1D.

Figure 1E:
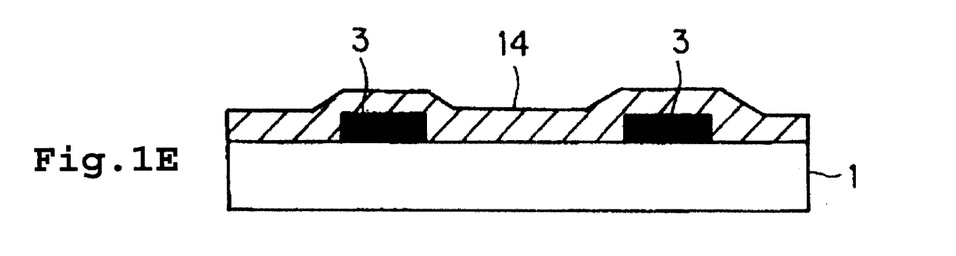

(5) Next, as shown in FIG. 1E, an adhesion-improving agent such as 3 APS (3-aminopropylsilane) is applied to the substrate 1, and a negative type photosensitive polyimide varnish 14 such as "PHOTONESE UR-3180E" made by Toray Industries Inc. is applied as a resist resin to the substrate 1 by spin coating at about 2,150 rpm for about 30 seconds. The substrate 1 is then subjected to prebaking over a hotplate at about 60° C. for about six minutes followed by about 80° C. for about six minutes and then about 100° C. for about six minutes.

Figure 1F:
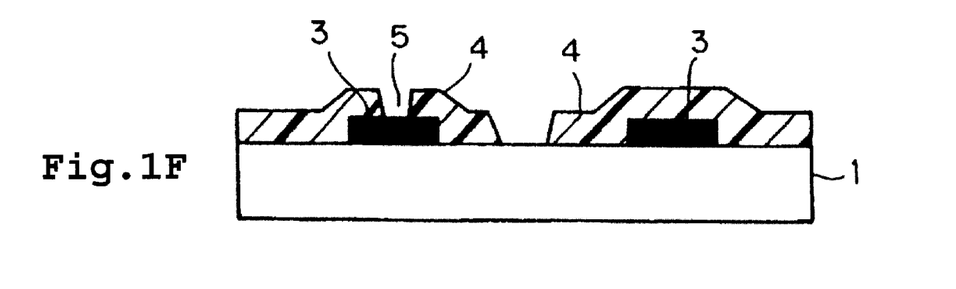

(6) Next, the substrate 1 is irradiated with the h-ray at about 400 mJ/cm$^2$ using a contact exposure apparatus. The substrate 1 is then immersed in a developing solution dedicated to a polyimide resin such as "DV-605" made by Toray Industries Inc. for about 7.5 minutes to remove the unexposed portions, and then is subjected to thermal polymerization of the polyimide varnish by curing the substrate 1 at about 400° C. for about one hour in a nitrogen atmosphere with an oxygen concentration of not more than about 100 ppm, to form an organic insulating film (polyimide pattern) 4 having a film thickness of about 15 $\mu$m, and equipped with holes 5 that define via holes at specified locations, as shown in FIG. 1F.

(7) Next, surface treatment of the organic insulating film (polyimide pattern) 4 and removal of an oxidized surface film on the lower thin film electrode 3 are performed. It is to be noted, here, that adverse influences on the electrical properties of the organic insulating film 4 are avoided in this preferred embodiment by setting the etching rate of the organic insulating film 4 to not more than about ¼ of that of the lower thin film electrode 3, such that the amount of decrease in the thickness of the organic insulating film 4 is restricted to about 25 nm or less.

To be more specific, an Ar ion irradiation machine was used under the conditions of an RF power of about 400 W, an Ar gas flow amount of about 20 sccm, a back pressure of about 5.2×10$^{-4}$ Torr, and an electric current density of the ion beam of about 0.35 mA/cm$^2$ for about four minutes in this preferred embodiment. The etching rate of the organic insulating film 4 was about 3.5 nm/min, while the etching rate of the lower thin film electrode 3 was about 22 nm/min.

In this step, carboxyl groups and carbonyl groups are generated on the surface of the organic insulating film 4, such that a modified surface layer having a surface modification coefficient of about 0.16 is formed on the surface of the organic insulating film 4.

Also in this step, the lower thin film electrode (Cu) 3 is etched by about 100 nm. It is to be noted that, if the organic insulating film (polyimide) 4 is also etched and thinned out to the same level of about 100 nm, the desired electrical properties are not obtained.

Figure 2A:
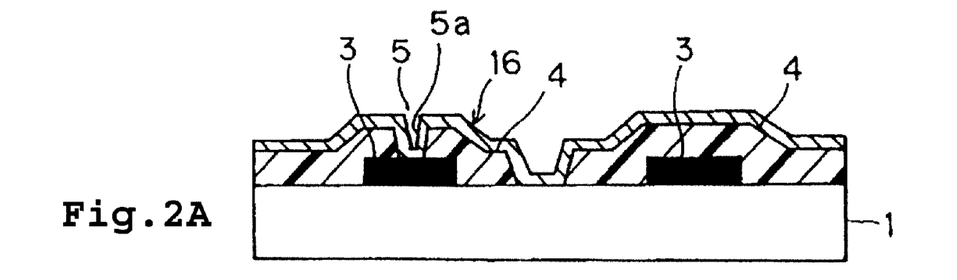
FIGS. 2A to 2D are cross-sectional views showing other steps for manufacturing a thin film circuit substrate according to preferred embodiments of the present invention.

(8) Then, the substrate 1 is placed in a vacuum deposition apparatus to form a Ti film (base film) having a film thickness of about 100 nm as a layer to securely adhere to the organic insulating film 4, and subsequently, a Cu film having a film thickness of about 1 $\mu$m is deposited, such that an electrode film 16 for the upper thin film electrode composed of the Ti and Cu films is formed as shown in FIG. 2A. Here, a portion of the electrode film 16 defines via hole conductors 5a that electrically connect the lower thin film electrode 3 and the upper thin film electrode 6.

(9) Next, spin coating is carried out at about 2,000 rpm for about 30 seconds, using a positive-type resist formulation for use in electrode etching (AZ1500 made by Clariant GmbH) to form a resist having a film thickness of about 1.5 $\mu$m. Then, the substrate 1 is subjected to prebaking in a clean oven at about 90° C. for about 30 minutes, is subjected to exposure with the h-ray using a contact exposure apparatus, and is immersed in an alkaline developing solution AZ400K (made by Clariant GmbH) for two minutes. Thereafter, it is washed with pure water for about five minutes or more, and is dried in a spin drying machine to form a resist layer 7 at a predetermined region as shown in FIG. 2B.

Figure 2B:
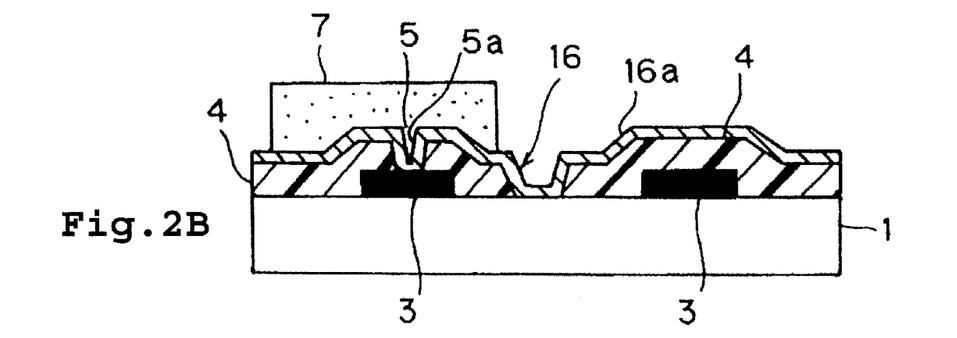
Figure 2C:
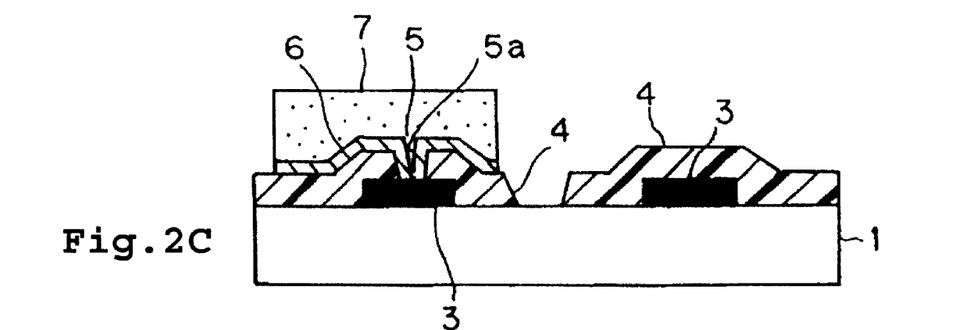

(10) Next, wet etching is carried out to remove an undesired portion 16a as shown in FIG. 2B from the electrode film 16 for the upper thin film electrode 6. The result is shown in FIG. 2C. More specifically, the substrate 1 is immersed in an aqueous ferric chloride solution for about one minute to etch the Cu film, and then is immersed in a 5% aqueous hydrofluoric acid solution for about 30 seconds to etch the Ti film. Thereafter, the substrate 1 is washed with pure water for about five minutes or more, and is then dried in a spin drying machine.

Figure 2D:
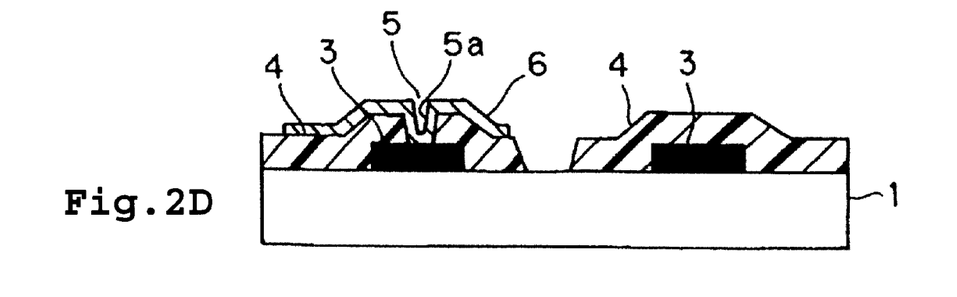

(11) Next, the substrate 1 is immersed in acetone for about five minutes to peel the resist off, is washed with pure water for about five minutes or more, and then is dried in a spin drying machine to form an electrode pattern (upper thin film electrode) 6 as shown in FIG. 2D.

Due to this, a thin film circuit substrate according to a preferred embodiment of the present invention is produced and includes the substrate 1, the lower thin film electrode 3 with a specific pattern provided on the surface of the substrate 1, the organic insulating film 4, and the upper thin film electrodes 6 with a specific pattern that is provided on the organic insulating film 4.

The adhesion between the organic insulating film 4 in a thin film circuit substrate prepared as described above and upper thin film electrodes 6 provided on the surface thereof was evaluated as follows.

1. Adhesion Evaluation Test

Figure 3:
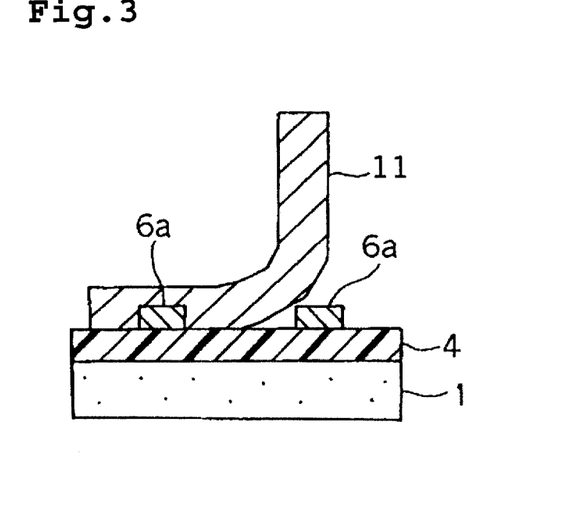
FIG. 3 is a cross-sectional view showing the procedure of a tape peeling test for evaluating the adhesion strength between an upper thin film electrode and an organic insulating film.

In this evaluation of the adhesion between the organic insulating film 4 and the upper thin film electrode 6, with reference to FIG. 3, thin film electrodes 6a corresponding to the upper thin film electrodes 6 were formed on the organic insulating film 4 formed on the substrate 1, a tape 11 with a strength of about 558 g/cm for evaluating adhesion strength was stuck to the thin film electrodes 6a, and then a tape peeling test was carried out by peeling the tape 11 while keeping the peeled portion of the tape 11 perpendicular to the substrate 1. It is to be noted that the lower thin film electrodes 3 were not formed on the substrate 1 in this test.

It is also to be noted that, in this tape peeling test, the thin film electrodes 6a were peeled off the organic insulating film 4 while it was stuck to the tape 11, when the adhesion strength between the organic insulating film 4 and the thin film electrodes 6a was insufficient.

In this preferred embodiment, samples of a Comparative Example in which no surface treatment was performed on the organic insulating film 4, and samples of an Example according to preferred embodiments of the present invention in which surface treatment of the organic insulating film 4 was performed with Ar ion irradiation were prepared, and they were subjected to the tape peeling test for evaluating the adhesion.

In the samples of the Comparative Example and the Example according to preferred embodiments of the present invention for use in this tape peeling test, the width of the thin film electrodes 6a (electrode line width) was about 5 μm. The number of samples was 400.

2. Results of the Adhesion Evaluation

The above-described tape peeling test indicated that in the samples of the Comparative Example in which no surface treatment was performed on the organic insulating film 4, the percentage of samples in which the thin film electrodes 6a were peeled off the organic insulating film 4 was 57.9%, while the percentage was 0.0% in the samples of the Example according to preferred embodiments of the present invention in which surface treatment was performed on the organic insulating film 4. This proves that the adhesion between the organic insulating film 4 and thin film electrodes 6a is greatly improved by subjecting the organic insulating film 4 to the surface treatment.

Sample organic insulating films 4 surface-treated with an Ar ion as described above were tested to determine the surface modification coefficient.

The surface modification coefficient of an organic insulating film is the ratio of the total amount of the functional group to the total amount of C existing on the surface of an organic insulating film, and is determined by the following equation (1):

$$\text{surface modification coefficient} = \text{total amount of the functional groups}/\text{total amount of C existing on the surface of the organic insulating film} \quad (1).$$

In the samples of Example according to preferred embodiments of the present invention in which the surface treatment was performed (see FIG. 4), the compositional ratio of C for each bond on the surface of an organic insulating film was about 84 atm % for a C—H bond and/or C—C bond, 10 atm % for a —C=O bond, and about 6 atm % for a —COO bond. The compositional ratio of the functional groups to C existing on the surface of the organic insulating film was approximately 16 atm %, that is, the sum of the approximately 10 atm % for the —C=O bond and the approximate 6 atm % for the —COO bond. Thus, the surface modification coefficient was about 0.16 ($16/100$=0.16) according to the above-described equation (1) in this case.

Various samples were prepared to examine the adhesion strength between the organic insulating film 4 and the upper thin film electrode 6. As a result, it was found that when the surface modification coefficient was less than about 0.1, the adhesion strength was insufficient, and when it is greater than about 0.5, the electrical properties of the organic insulating film 4 deteriorates.

Figure 5:
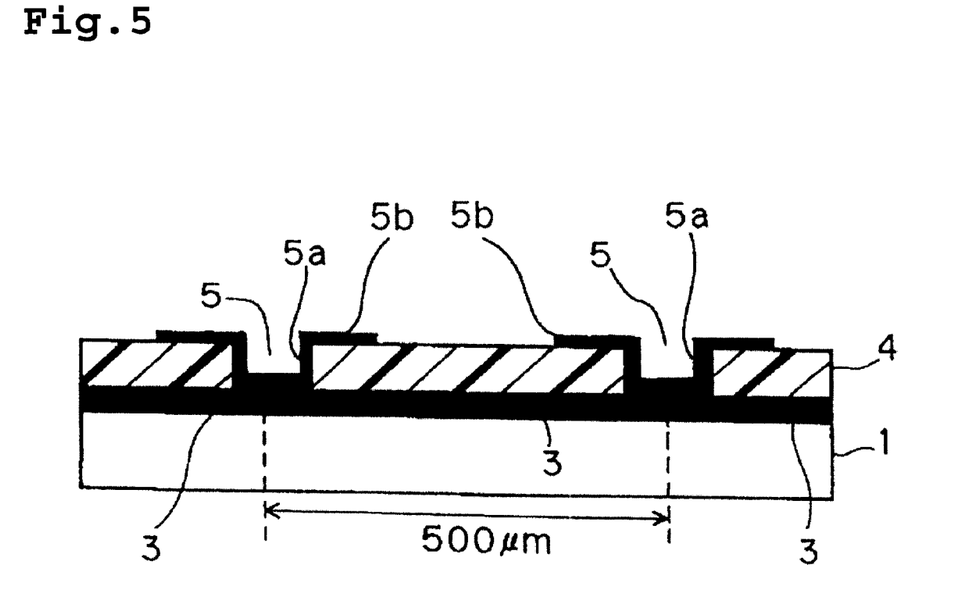
FIG. 5 is a cross-sectional view showing the measurement of the connection resistance between an upper thin film electrode and a lower thin film electrode.

Next, the connection resistance between the upper thin film electrode 6 and the lower thin film electrode 3 connected through via holes 5 provided in the organic insulating film 4 was evaluated using a digital multimeter. Accordingly, a lower thin film electrode 3 having a thickness of about 5 μm, an organic insulating film 4 having a thickness of about 15 μm and with via holes 5 having a square shape in plan view with a width of about 100 μm and a length of about 100 μm, and via hole pads 5b were provided in this order on the substrate 1 as shown in FIG. 5. Then, the connection resistance between the via holes 5 with the mutual distance being about 500 μm was measured by a four-terminal method (number of samples=400).

As a result, it was confirmed that the connection resistance was as high as about 960 mΩ when no surface treatment with Ar ions was performed, while it was as low as about 4.7 mΩ for the samples of the Example according to preferred embodiments of the present invention in which the surface treatment with Ar ions was performed.

The reason for the latter is that the oxidized surface film on the lower thin film electrode 3 was removed by the Ar ions that passed through the via holes 5 to reach the lower thin film electrode 3.

Although the above-described preferred embodiment was described for a case in which an Ar ion irradiation method was used as the surface treating method, it is possible to use ions of other inert gases such as He, Ne, Kr and Xe for the irradiation.

Furthermore, although Cu was used as the material defining the upper thin film electrode and the lower thin film electrode (with a Ti layer functioning as a layer for improved adherence) in the above-described preferred embodiment, various materials including at least one constituent selected from the group consisting of Ag, Al, Ni, Ti, Cr, NiCr, and Nb, can be used for the purpose.

Furthermore, although a polyimide resin was used as a material of the organic insulating film in this preferred embodiment, various resins can be employed for the purpose, such as an epoxy resin, a benzocyclobutene resin, a bismaleimide triazine resin, an acrylic resin, and a cyclic olefin resin.

While the present invention has been described with reference to preferred embodiments, it is to be understood that the present invention is not limited to the disclosed preferred embodiments. On the contrary, the present invention is intended to cover various modifications and equivalent arrangements included within the spirit and scope of the appended claims. The scope of the following claims is to be accorded the broadest interpretation so as to encompass all such modifications and equivalent structures and functions.

As described above, one preferred embodiment of the present invention provides a method for manufacturing a thin film circuit substrate including the steps of forming a lower thin film electrode on a substrate, forming an organic insulating film on the lower thin film electrode, forming a via hole in the organic insulating film, then irradiating the substrate with at least one type of ion of an inert gas selected from the group consisting of He, Ne, Ar, Kr, and Xe, to remove oxidized surface film on the lower thin film electrode, and to generate at least one type of functional group selected from the group consisting of a sulfone group, a carboxyl group, a carbonyl group, and a phenol group on the surface of the organic insulating film, such that a modified surface layer with a surface modification coefficient of about 0.1 to about 0.5 is formed on the surface of the organic insulating film. Accordingly, the surface treatment of the organic insulating film and the removal of the oxidized surface film on the lower thin film electrode are performed at the same time, and therefore, the manufacturing process for a thin film circuit substrate is greatly simplified. Additionally, a thin film circuit substrate having excellent adhesion strength between its organic insulating film and its upper thin film electrode as well as excellent reliability of electroconductivity between the upper thin film electrode and its lower thin film electrode is efficiently manufactured.

Another preferred embodiment of the present invention provides a method for manufacturing a thin film circuit substrate as described above, wherein at least one resin selected from the group consisting of a polyimide resin, an epoxy resin, a benzocyclobutene resin, a bismaleimide triazine resin, an acrylic resin, and a cyclic olefin resin is used as a material for the organic insulating film. Accordingly, at least one type of functional group selected from the group consisting of a sulfone group, a carboxyl group, a carbonyl group, and a phenol group on the surface of the organic insulating film is generated, such that a modified surface layer with a surface modification coefficient of about 0.1 to about 0.5 is formed on the surface of the organic insulating film.

Still another preferred embodiment of the present invention provides a method for manufacturing a thin film circuit substrate as described above, wherein at least one constituent selected from the group consisting of Cu, Ag, Al, Ni, Ti, Cr, NiCr, and Nb is used for the upper thin film electrode and the lower thin film electrode. Accordingly, a thin film circuit substrate having thin film electrodes with excellent electroconductivity is effectively manufactured.

Still another preferred embodiment of the present invention is a method for manufacturing a thin film circuit substrate as described above, wherein the etching rate of the organic insulating film by an inert gas ion is not more than about ¼ of that of the lower thin film electrode. Accordingly, adverse effects to the electrical properties of the organic insulating film due to its thinning are effectively prevented, such that thin film circuit substrates with higher reliability are manufactured. That is, by using an inert gas ion that provides a large difference of etching rates between the lower thin film electrode and the organic insulating film, and that is capable of surface-treating the organic insulating film to generate functional groups, the surface treatment of the organic insulating film and the removal of the oxidized surface film on the lower thin film electrode at the same time is efficiently performed, thus greatly simplifying the manufacturing process and greatly reducing the manufacturing costs.

Still another preferred embodiment of the present invention is a thin film circuit substrate, wherein the oxidized surface film provided on a region of the lower thin film electrode is removed, the region being connected to the upper thin film electrode by via holes. Accordingly, the reliability of electroconductivity between the upper thin film electrode and the lower thin film electrode is outstanding. Furthermore, since a modified surface layer is provided on the surface of the organic insulating film that has a surface modification coefficient of about 0.1 to about 0.5, a thin film circuit substrate with excellent adhesion strength between the organic insulating film and the upper thin film electrode is obtained. Thus, a thin film circuit substrate according to preferred embodiments of the present invention is efficiently manufactured by the manufacturing methods described above.

Still another preferred embodiment of the present invention is a thin film circuit substrate as described above, wherein the organic insulating film includes at least one resin selected from the group consisting of a polyimide resin, an epoxy resin, a benzocyclobutene resin, a bismaleimide triazine resin, an acrylic resin, and a cyclic olefin resin. Accordingly, functional groups such as a sulfone group, a carboxyl group, a carbonyl group, and a phenol group are generated on the surface of the organic insulating film, such that a modified surface layer with a surface modification coefficient of about 0.1 to about 0.5 is provided on the surface of the organic insulating film. The reliability of the substrate is thus greatly improved.

Still another preferred embodiment of the present invention is a thin film circuit substrate as described above, wherein each upper thin film electrode and lower thin film electrode includes at least one constituent selected from the group consisting of Cu, Ag, Al, Ni, Ti, Cr, NiCr, and Nb. Accordingly, the electroconductivity of the thin film electrodes are greatly improved and a thin film circuit substrate having outstanding electrical properties is provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A thin film circuit substrate comprising:
   a substrate;

a lower thin film electrode provided on the surface of said substrate;

an organic insulating film having a via hole, said organic insulating film provided to cover at least said lower thin film electrode; and an upper thin film electrode provided on said organic insulating film, said upper thin film being connected to said lower thin film electrode through said via hole, wherein an oxidized surface film of said lower thin film electrode is removed at a region where said lower thin film electrode is connected to said upper thin film electrode through said via hole; and a modified surface layer is provided on the surface of said organic insulating film, the modified surface layer having a surface modification coefficient of about 0.1 to about 0.5 determined by equation (1):

*surface modification coefficient=total amount of the functional groups/total amount of C existing on the surface of the organic insulating film* (1).

2. A thin film circuit substrate according to claim 1, wherein said organic insulating film comprises at least one resin selected from the group consisting of a polyimide resin, an epoxy resin, a benzocyclobutene resin, a bismaleimide triazine resin, an acrylic resin, and a cyclic olefin resin.

3. A thin film circuit substrate according to claim 1, wherein each of said upper thin film electrode and said lower thin film electrode comprises at least one constituent selected from the group consisting of Cu, Ag, Al, Ni, Ti, Cr, NiCr, and Nb.

4. A thin film circuit substrate according to claim 1, wherein the organic insulating film comprises polyimide resin.

5. A thin film circuit substrate according to claim 1, wherein each of said upper thin film electrode and said lower thin film electrode comprises copper.

6. A thin film circuit substrate according to claim 1, wherein each of said upper thin film electrode and said lower thin film electrode comprises a titanium film and a copper film.

7. A thin film circuit substrate according to claim 1, wherein said substrate comprises alumina.

8. A thin film circuit substrate according to claim 1, wherein said substrate comprises a semiconductor material.

9. A thin film circuit substrate according to claim 1, wherein said substrate comprises a ceramic material.

10. A thin film circuit substrate according to claim 1, wherein the total amount of the functional groups and the total amount of C existing on the surface of the organic insulating film are measured in atm %.

* * * * *